United States Patent [19]

Van Tran

[11] Patent Number: 4,794,280

[45] Date of Patent: Dec. 27, 1988

[54] DARLINGTON BICMOS DRIVER CIRCUIT

[75] Inventor: Hiep Van Tran, Carrollton, Tex.

[73] Assignee: Texas Instruments Incorporated, Dallas, Tex.

[21] Appl. No.: 158,004

[22] Filed: Feb. 16, 1988

[51] Int. Cl.[4] ............... H03K 19/02; H03K 3/26; H03K 17/60; H03K 17/687

[52] U.S. Cl. ............... 307/446; 307/443; 307/585; 307/482; 307/570; 307/270; 307/315

[58] Field of Search ............... 307/443, 475, 446, 448, 307/450, 451, 270, 246, 570, 571, 578, 579, 585, 584, 264, 482

[56] References Cited

U.S. PATENT DOCUMENTS

| | | | |
|---|---|---|---|
| 4,301,383 | 11/1981 | Taylor | 307/446 |
| 4,558,234 | 12/1985 | Suzuki et al. | 307/443 |
| 4,661,723 | 4/1987 | Masuda et al. | 307/451 |
| 4,694,203 | 9/1987 | Uragami et al. | 307/270 |
| 4,733,110 | 3/1988 | Hara et al. | 307/451 |

FOREIGN PATENT DOCUMENTS

| | | | |
|---|---|---|---|
| 0025424 | 2/1984 | Japan | 307/446 |
| 0025423 | 2/1984 | Japan | 307/446 |

*Primary Examiner*—Stanley D. Miller
*Assistant Examiner*—Trong Quang Phan
*Attorney, Agent, or Firm*—Stanton C. Braden; James T. Comfort; Melvin Sharp

[57] ABSTRACT

A driver circuit is provided which offers decreased input loading, increased output loading, and a high voltage output level corresponding to a logic-1. These results are achieved through the use of pull-up transistors and capacitive and resistive circuitry which allow bootstrapped voltages.

17 Claims, 9 Drawing Sheets

DARLINGTON BICMOS DRIVER CIRCUIT

BACKGROUND OF THE INVENTION

For purposes of insuring the integrity of a voltage level corresponding to a logic-1 in a load connected to the output of a BiCMOS driver circuit, it is desirable to have logic-1 from the output of the driver near or above the supply voltage to the driver circuit. If this desired situation were to occur, better discrimination between logic-0 and logic-1 would be possible. Additionally, for the sake of switching speed or rather a fast response time, it is desirable to have a BiCMOS driver which has low input loading (low amount of current drawn by the input of the circuit). Furthermore, high output loading capability (capability of supplying high current to an output load) is desired. Unfortunately, prior art BiCMOS drivers have been unable to furnish low input loading together with high output loading capability and a logic-1, at their outputs, near or above the supply voltage of the driver circuit.

A more detailed explanation of the limitations and problems associated with the prior art follows below with references to the accompanying FIGS. 1 and 2.

A standard BiCMOS driver is shown in FIG. 1. A logic-0 (low voltage) at the input node, IN, produces a logic-1 at node A from CMOS inverter 2. NMOS transistors 4 and 6 and bipolar transistor 8 are turned off due to the logic-0 at input node, IN. Node A has a voltage potential of approxiamately Vcc, the circuit supply voltage. Pull-up bipolar transistor 10 turns on due to the Vcc voltage from node A at its base and thus delivers power to output node, OUT.

Switching speed of the BiCMOS driver, shown in FIG. 1, is dependent upon the size of PMOS transistor 16 of CMOS inverter 2. The larger PMOS transistor 16 is, the more charges required to charge up MOS capacitor 15 in PMOS transistor 16 and therefore, the more current required to charge up or discharge capacitor 15, i.e. the more input loading. Consequently, switching speed of the BiCMOS driver decreases with an increasing size of PMOS transistor 16 (assuming that MOS capacitor 15 in PMOS transistor 16 increases with the size of PMOS transistor 16). Therefore, in order to increase switching speed, input loading of MOS capacitor 15 within PMOS transistor 16, should be decreased and consequently the size of PMOS transistor 16 should be decreased. However, since the pull-up speed of bipolar transistor 10 directly affects the switching speed of the BiCMOS driver, a large PMOS transistor 16 is required to quickly supply enough power to the base of bipolar transistor 10 so that it ca quickly pull up the voltage at output node OUT. Therefore, in the prior art, maximum switching speed of the BiCMOS driver could not be attained due to constraints on the size of PMOS transistor 16 and base loading requirements of bipolar transistor 10.

High output loading capability is determined by the size of pull-up bipolar transistor 10. A high output loading capability is desired since increased output loading capability necessarily implies the ability to drive a larger load at the output and/or increased fan-out (fan-out being the maximum number of lines that can be driven by an output line) from node OUT. Pull-up bipolar transistor 10 must be large in order to provide enough current to output node OUT so that high output loading is possible. This further adds a constraint on PMOS transistor 16's size in that PMOS transistor 16 must be large in order to drive pull-up bipolar transistor 10. Large PMOS transistor 16 creates a low resistance path to Vcc during times it is turned on (input node IN at logic-0) to prevent the base of the pull-up, node A, from booting (rising) significantly higher than Vcc. Since the resistance associated with PMOS transistor 16 is small, the RC time constant associated with parasitic capacitor 12 is relatively small. Charge leaks off the plate connected to node A of parasitic capacitor 12 too quickly to enable it to boot (raise) node A significantly past Vcc. Thus, the output node of the BiCMOS driver, node OUT, is only pulled up to approximately Vcc—Vbe. A timing diagram for the circuit in FIG. 1 is shown in FIG. 2. As shown in FIG. 2 a high output loading along with a maximally high voltage level corresponding to logic-1 could not be attained by the prior art.

OBJECTS OF THE INVENTION

It is therefore a primary object of the present invention to provide a new and improved device BiCMOS driver circuit.

It is a further object of the present invention to provide a new and improved BiCMOS driver circuit which provides fast switching speed.

It is still a further object of the invention to provide a new and improved BiCMOS driver circuit which provides low input loading.

It is yet still a further object of the invention to provide a new and improved BiCMOS driver circuit which provides high output loading.

It is another object of the invention to provide a new and improved BiCMOS driver circuit which provides a high output level logic-1.

SUMMARY OF THE INVENTION

The foregoing objects of the invention are accomplished by a BiCMOS driver circuit which uses capacitance to bootstrap its logic-1 output level up to or near the circuit supply voltage. The BiCMOS driver allows low input loading by providing a circuit at the input comprising a CMOS inverter which includes a relatively small p-channel transistor. The BiCMOS driver further provides high output loading by connection of the p-channel transistor to a bipolar transistor which forms a darlington configuration with a pull-up transistor at the output of the circuit.

DETAILED DESCRIPTION OF THE INVENTION

Figure 1:
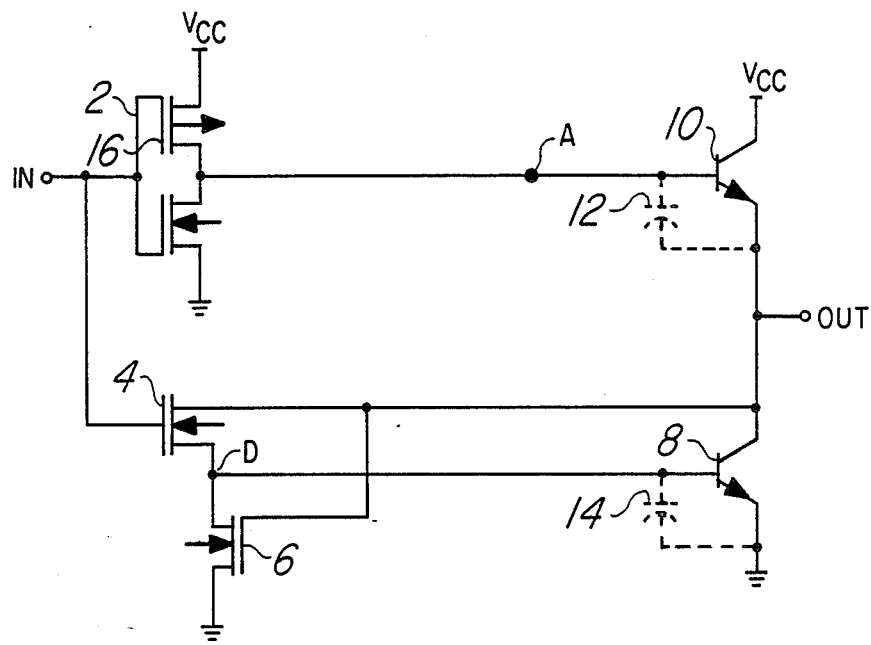
FIG. 1 is a prioraart drawing of a BiCMOS driver circuit.
Figure 2:
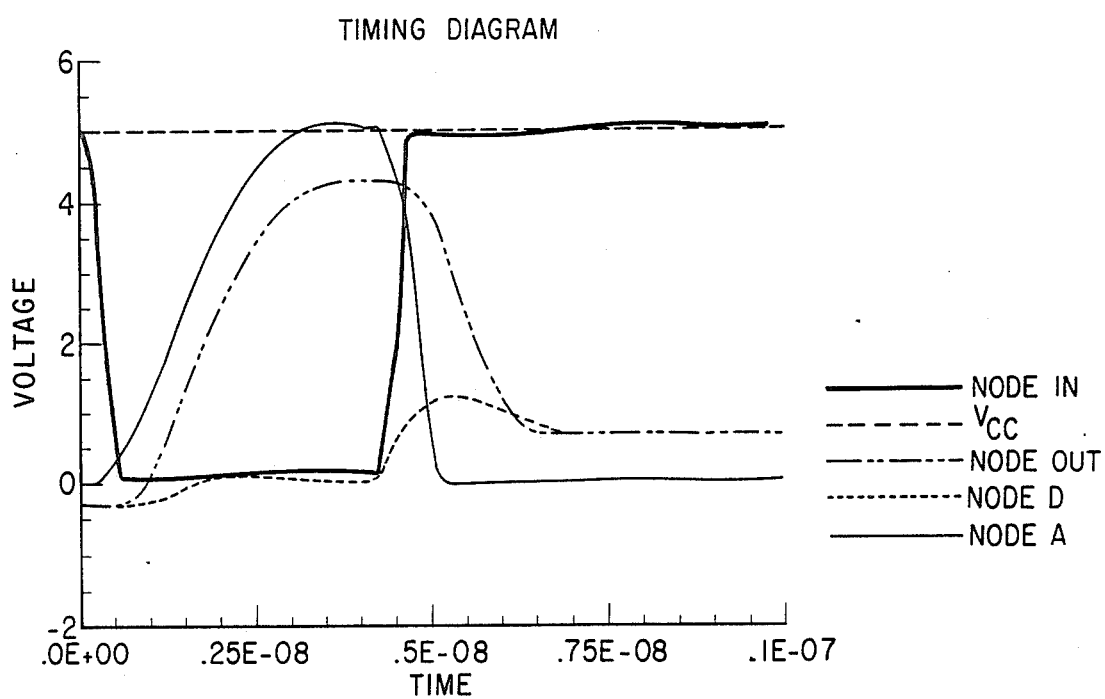
FIG. 2 is a timing diagram showing key node voltages, of the prior art BiCMOS driver circuit in FIG. 1, over a time interval.
Figure 3:
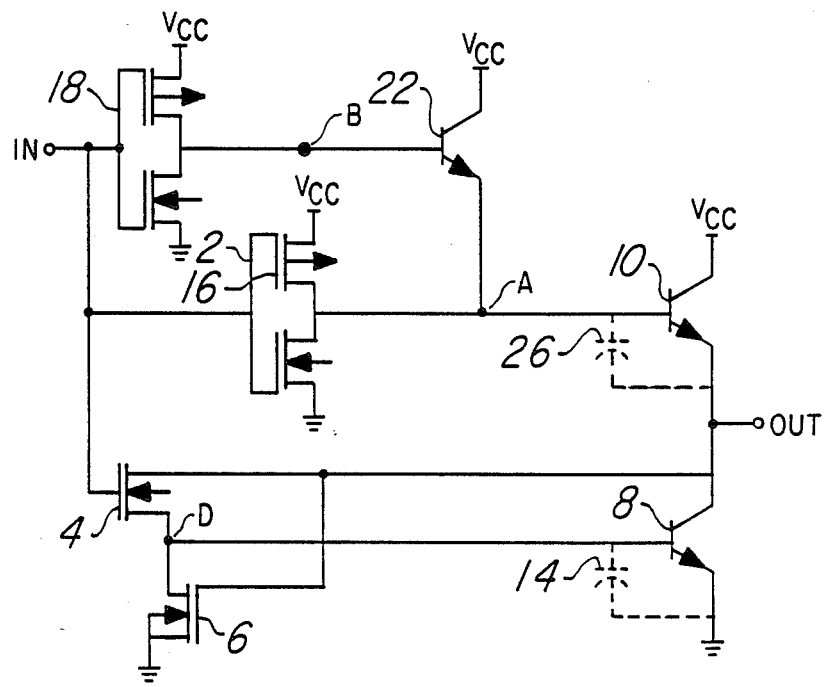
FIG. 3 illustrates a first preferred embodiment of the invention wherein parasitic capacitance is used to bootstrap the voltage of the base of a pull-up transistor past Vcc.
Figure 4:
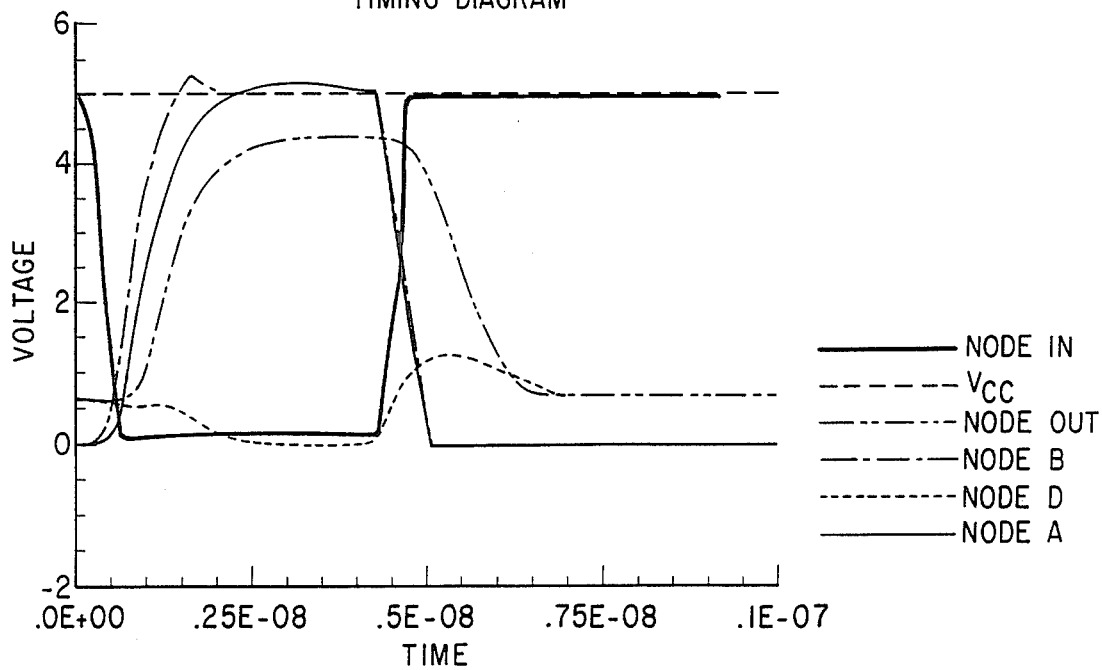
FIG. 4 is a timing diagram, showing key node voltages of the invention over a time interval, of the first preferred embodiment of the invention shown in FIG. 3.

FIG. 3 is a schematic drawing of one preferred embodiment of the invention. Bipolar transistor 22 is connected to pull-up bipolar transistor 10 in a darlington configuration in order to increase the current gain measured from node OUT to node B. CMOS inverter 18 drives transistor 22 and is connected to the base of transistor 22. Bipolar transistor 10 is connected to the output of CMOS inverter 2 which includes p-channel transistor 16. Node OUT, is connected to the emitter of transistor 10 and to pull down means comprising bipolar transistor 8, and n-channel transistors 4 and 6. A small size for p-channel transistor 16 is now permitted (for instance, a channel width of 24 microns as opposed to a prior art channel width of 200 microns) and used since transistor 22 can provide enough current to pull-up transistor 10 in order to furnish a high output loading characteristic for the circuit. A low input loading is now provided since transistor 16 is small. Parasitic capacitor 12 can now be used advantageously since small p-channel transistor 16 provides a large enough impedance path between Vcc and node A such that the RC time constant associated with p-channel transistor 16 and parasitic capacitor 12 is relatively large. Parasitic capacitor 12 can now bootstrap the voltage on node A up significantly past Vcc due to the fact that the discharge rate of capacitor 12 is now long. Node A will eventually drop in voltage down to Vcc, and node OUT will drop down in voltage to Vcc-Vbe. However, by that time the driving function of the circuit has been completed. A higher voltage level, above that found in the prior art is now available for logic-1 levels. The restoof the circuit shown in FIG. 3 works as follows: Pull-down bipolar transistor 8 serves to pull the output node, OUT, down near ground, corresponding to a logic-0. N-channel transistor 6 discharges parasitic capacitor 14 at appropriate time intervals, i.e. during a high output at output node OUT. N-channel transistor 4 drives transistor 8 during times a logic-0 is desrred at the output. For a more in-depth analysis of the above BiCMOS circuit, FIG. 4 illustrates a timing diagram showing the voltages at key locations, at certain times, in the circuit. A shown in FIG. 4, Nodes OUT, B and A are rising with a low input level. Note the increased rise times associated with these nodes as opposed to the prior art nodes shown in FIG. 2.

Figure 5:
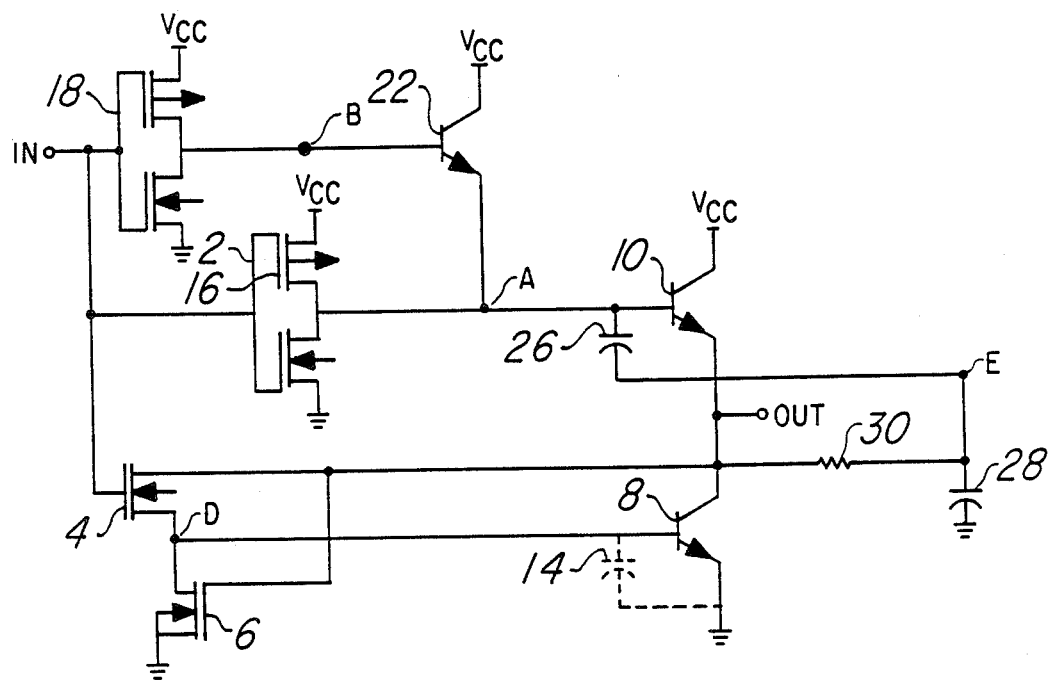
FIG. 5 illustrates a second prefered embodiment of the invention wherein a capacitor circuit is used to bootstrap the voltage of the base of a pull-up transistor past Vcc.
Figure 6:
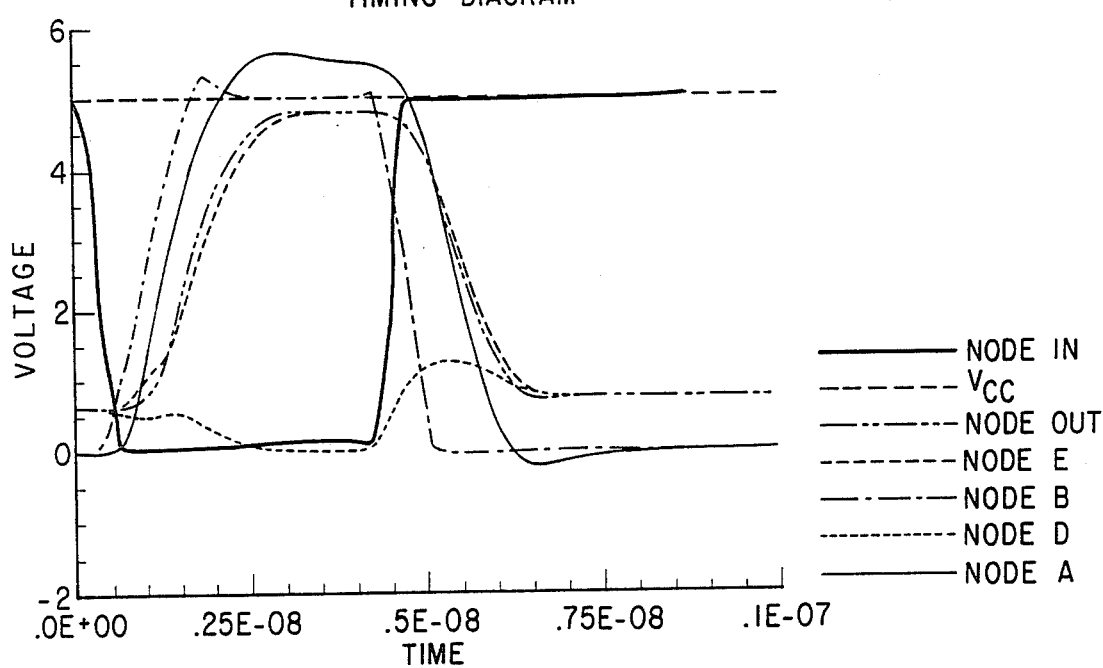
FIG. 6 is a timing diagram, showing key node voltages over a time interval, of the embodiment of the invention shown in FIG. 5.

FIG. 5 is a schematic drawing of a second preferred embodiment of the invention. This embodiment is the same as that shown in FIG. 3 except that it adds a nonparasitic capacitor 26 connected across the base-emitter junction of transistor 10 to boot node A up significantly past Vcc. Additionally, the nonparasitic capacitor circuit allows output node OUT to reach higher levels and switches faster than the embodiment shown in FIG. 3. This circuit removes the dependency of booting up node A solely from parasitic capacitor 12. The operation of this circuit is as follows: During the time output node OUT switches from low to high, ndde E is lagging in voltage behind node OUT because of the loading effect of capacitor 28. Capacitor 28 charges up until the voltage at node OUT equals the voltage at node E at which time current from node OUT t node E through resistor 30 stops flowing. At the same time node A has been bootstrapped up past Vcc as a consequence of the increasing charge at node E. Node A begins its drop in voltage from above Vcc to approximately Vcc at approximately the time node E reaches approximately Vcc. This drop is caused by the discharge of the plate of capacitor 26, through transistor 16 at its Vcc connection, which is connected to node A. FIG. 6 illustrates a timing diagram showing voltages at key locations, at certain times, in the circuit. As can be seen from FIG. 6 the rise times and voltage limits reached are higher than those of the prior art shown in FIG. 2. Additionally, the voltage limits and rise times are higher than those shown in FIG. 4.

Figure 7:
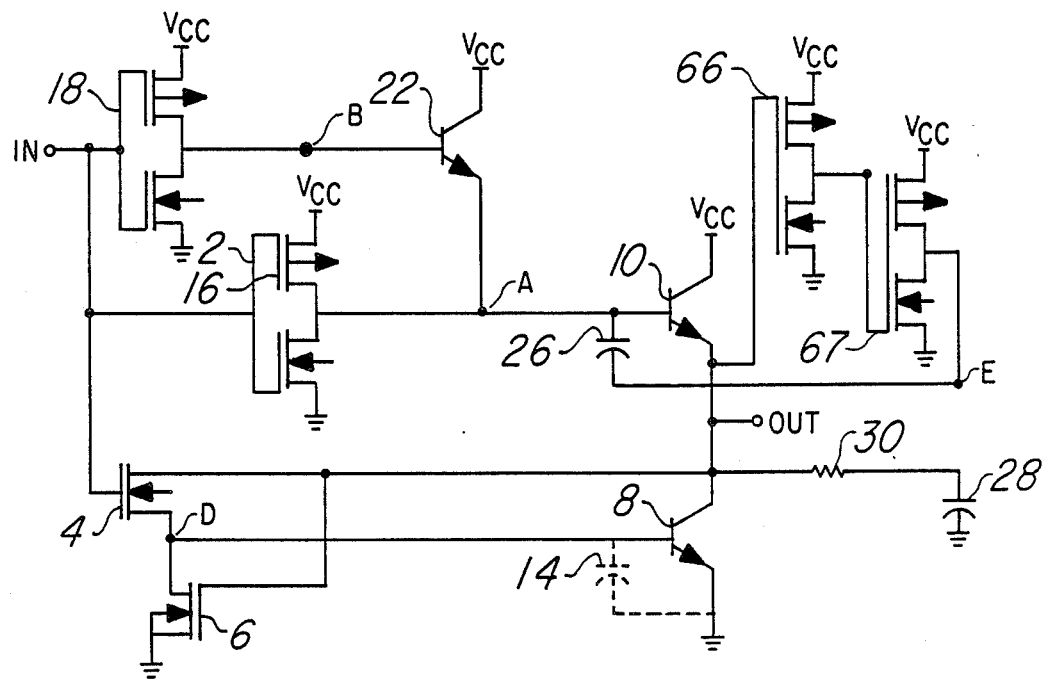
FIG. 7 illustrates a third preferred embodiment of the invention wherein two inverters are substituted for components found in the capacitor circuit of the second preferred embodiment found in FIG. 5.
Figure 8:
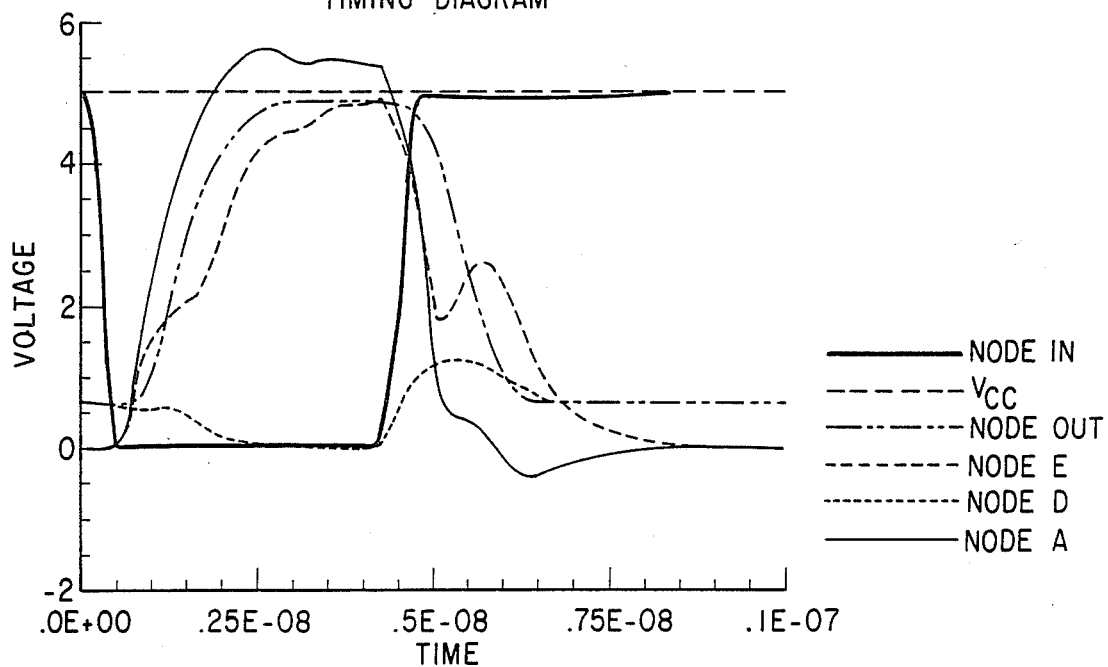
FIG. 8 is a timing diagram, showing key node voltages over a time interval, of the embodiment of the invention shown in FIG. 7.

FIG. 7 illustrates a third preferred embodiment of invention which is a variation of FIG. 5 wherein capacitor 28 and resistor 30 of FIG. 5 are replaced by two CMOS inverters in series. The two CMOS inverters 66 and 67 offer decreased internal loading over the capacitor and resistor circuit. The timing diagram for this circuit is shown in FIG. 8. FIG. 8 demonstrates a flatter and higher output voltage characteristic than those shown in either FIGS. 2, 4, or 6.

Figure 9:
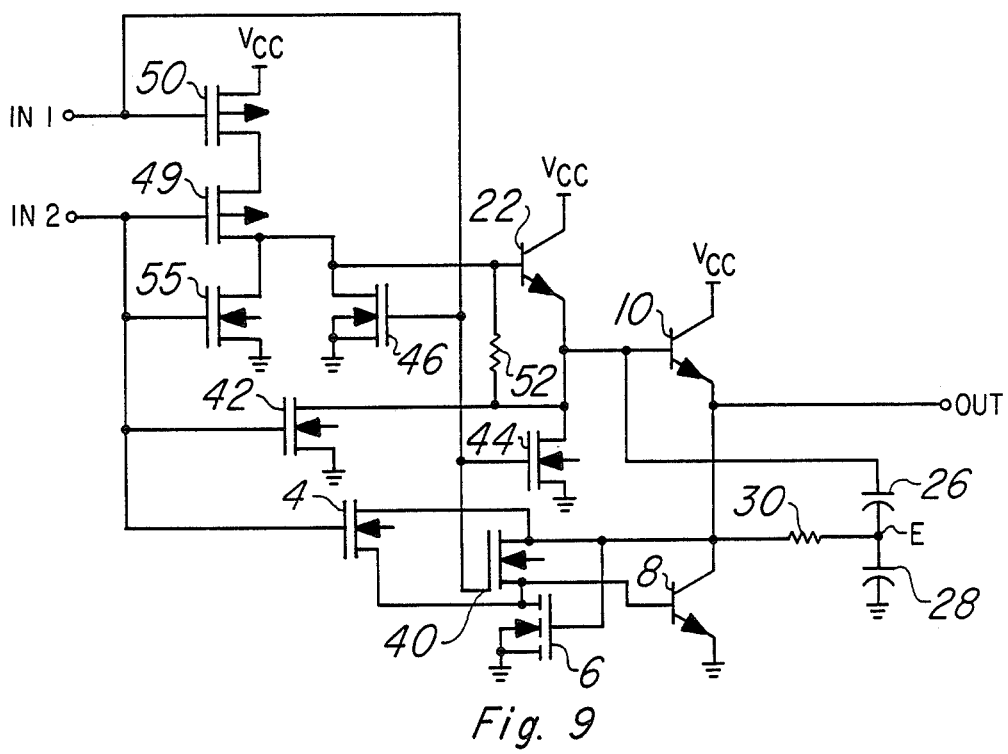
FIG. 9 illustrates a fourth preferred embodiment of the invention which accepts two inputs though a logic gate.

FIG. 9 illustrates a fourth preferred embodiment of the invention as a BiCMOS driver of FIG. 5 connected to a NOR gate such that the entire circuit of FIG. 9 can be characterized as a BiCMOS NOR driver. This circuit permits the use of a NOR driver without large loading inputs and therefore permits fast driver switching speed. Only inputs of logic-0 at inputs in1 and in2 will produce a logic 1 at the output. Current is allowed to travel through p-channel transistor 50, p-channel transistor 49 and into pull-up bipolar transistor 10 during the in1=logic-0 and in2=logic-0 inputs. All other inputs are prevented from letting current flow to the bases of either transistors 22 or 10 by circuitry which includes resistor 52 and n-channel transistors 40, 42, 44, 46, and 55.

It is also within the scope of the invention to preceed the BiCMOS drivers in the embodiments disclosed above with NOR gates including more than two inputs. Furthermore, NOR gate logic need not be used. The drivers could also be preceeded by an AND gate, NAND gate, or OR gate or a combination thereof, all of which may contain more than two inputs.

Although the invention has been described in detail herein with reference to its preferred embodiment and certain described alternatives, it is to be understood that this description is by way of example only, and is not to be construed in a limiting sense. It is to be further understood that numerous changes in the details of the embodiments of the invention, and additional embodiments of the invention, will now be apparent to, and may be made by a person of ordinary skill in the art having reference to this description. For instance, n-channel transistors may be substituted for p-channel transistors consistently throughout and vice-versa. Furthermore, although preferred, CMOS inverters need not be used. All existing types of inverters are contemplated. It is contemplated that all such changes and additional embodiments are within the spirit and true scope of the invention as claimed below. Accordingly, the invention is intended to be limited only by the scope of the appended claims.

I claim:

1. An improved driver circuit of the type including a first inverter connected to a first bipolar pull-up transistor including a parasitic capacitance between the base and emitter of the latter, wherein the improvement comprises:
   connecting a second bipolar pull-up transistor to said first bipolar pull-up transistor; and
   providing a resistance path within said first inverter capable of permitting said parasitic capacitor to boot said base of said first bipolar pull-up transistor above a first predetermined voltage so as to raise the emitter voltage of said first bipolar pull-up transistor above a second predetermined voltage.

2. A driver circuit as recited in claim 1 wherein said second bipolar pull-up transistor is connected to said first bipolar pull-up transistor so as to form a darlington configuration as between said bipolar pull-up transistors.

3. An improved driver circuit as recited in claim 1 wherein said first inverter is a CMOS inverter.

4. A driver circuit as recited in claim 1 further comprising a second inverter connected to the base of said second bipolar pull-up transistor.

5. A driver circuit as recited in claim 4 wherein said second inverter is a CMOS inverter.

6. An improved driver circuit as recited in claim 1 which further includes a voltage pulldown circuit connected to said emitter of said first bipolar pull-up transistor.

7. An improved driver circuit as recited in claim 1 wherein the base of the second bipolar pull up transistor is connected to circuitry which includes a logic gate selected from the group consisting of an OR gate, NOR gate, AND gate, NAND gate and a combination thereof.

8. An improved driver circuit of the type including a first inverter connected to a first bipolar pull-up transistor, wherein the improvement comprises:
   connecting a second bipolar pull-up transistor to said first bipolar pull-up transistor;
   connecting a capacitor circuit across the base and emitter of said first bipolar pull-up transistor; and
   providing a resistance path within said first inverter capable of permitting said capacitor circuit to boot said base of said first bipolar pull-up transistor above a first predetermined voltage so as to raise the emitter voltage of said first bipolar pull-up transistor above a second predetermined voltage.

9. A driver circuit as recited in claim 8 wherein said first inverter is a CMOS inverter.

10. A driver circuit as recited in claim 9 wherein said second bipolar transistor is connected to said first bipolar transistor so as to form a darlington configuration as between said bipolar transistors.

11. A driver circuit as recited in claim 8 wherein a second inverter is connected to the base of said second bipolar pull-up transistor.

12. An improved driver circuit as recited in claim 8 wherein said capacitor circuit includes:
    a first capacitor including a first and second plate, said first plate being connected to said base of said first bipolar pull-up transistor;
    a resistor connected to and between said second plate of said first capacitor and said emitter of said first bipolar pull-up transistor; and
    a second capacitor connected to said resistor and said second plate of said first capacitor.

13. An improved driver circuit as recited in claim 8 which further includes a pull-down circuit connected to the emitter of the first bipolar pull-up transistor.

14. An improved driver circuit as recited in claim 8 wherein said capacitor circuit includes:
    a first capacitor including a first and second plate, said first plate being connected to said base of said first bipolar pull-up transistor;
    a pair of inverters connected in series;
    said pair of inverters being connected to and between said second plate of said first capacitor and said emitter of said first bipolar pull-up transistor.

15. An improved driver circuit as recited in claim 8 wherein said base of said second bipolar pull-up transistor is connected to circuitry which includes a logic gate selected from the group consisting of a OR gate, NOR gate, AND gate, NAND gate and a combination thereof.

16. An improved driver circuit as recited in claim 11 which further includes a pull-down circuit connected to the emitter of the first bipolar pull-up transistor.

17. A driver circuit comprising:
    a first inverter;
    a first bipolar transistor connecte to the output of said first inverter;
    a second bipolar transistor connected to the base of said first bipolar transistor;
    a second inverter connected to the base of said first bipolar transistor; and
    voltage pull-down means connected to the output of said first bipolar transistor.

* * * * *

UNITED STATES PATENT AND TRADEMARK OFFICE
CERTIFICATE OF CORRECTION

PATENT NO. : 4,794,280

DATED : December 27, 1988

INVENTOR(S) : Hiep Van Tran

It is certified that error appears in the above-identified patent and that said Letters Patent is hereby corrected as shown below:

In column 1, line 52, delete "ca" and insert --can--.

In column 2, line 51, delete "prioraart" and insert --prior art--.

In column 3, line 54, delete "desrred" and insert --desired--.

In column 4, line 48, delete "preceed" and insert --precede--; and on line 52, delete "preceeded" and insert --preceded--.

Signed and Sealed this

Sixth Day of June, 1989

Attest:

DONALD J. QUIGG

Attesting Officer

Commissioner of Patents and Trademarks